(12) United States Patent
Andoh

(10) Patent No.: US 7,214,970 B2
(45) Date of Patent: May 8, 2007

(54) HERMETIC CONTAINER AND IMAGE DISPLAY APPARATUS

(75) Inventor: Tomokazu Andoh, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 241 days.

(21) Appl. No.: 10/931,049

(22) Filed: Sep. 1, 2004

(65) Prior Publication Data

US 2005/0051892 A1 Mar. 10, 2005

(30) Foreign Application Priority Data

Sep. 10, 2003 (JP) ............... 2003-317861

(51) Int. Cl.
*H01L 33/00* (2006.01)
(52) U.S. Cl. ............... 257/99; 257/81; 257/98
(58) Field of Classification Search ............... 257/88, 257/90, 94, 96–97, 98, 79, 82, 91, 99, 163, 257/194; 313/495; 438/22, 24
See application file for complete search history.

(56) References Cited

U.S. PATENT DOCUMENTS 5,821,689 A 10/1998 Andoh et al. ............... 313/495
6,605,893 B2 8/2003 Ando ............... 313/495
6,621,220 B1 9/2003 Hasegawa et al. ............... 313/634
2002/0180342 A1 12/2002 Yamada et al. ............... 313/493
2003/0090196 A1 5/2003 Ando ............... 313/495

FOREIGN PATENT DOCUMENTS

| JP | 8-83578 | 3/1996 |
|---|---|---|
| JP | 2000-311630 | 11/2000 |
| JP | 2001-210258 | 8/2001 |
| WO | WO00/51155 | 8/2000 |

*Primary Examiner*—Hoai Pham
*Assistant Examiner*—Dilinh Nguyen
(74) *Attorney, Agent, or Firm*—Fitzpatrick, Cella, Harper & Scinto

(57) ABSTRACT

A hermetic container includes a first substrate, a second substrate opposed to the first substrate, a frame arranged between the first substrate and the second substrate, and a composite member arranged between the first substrate and the second substrate. The frame is composed of a frame member, a first seal bonding material effecting seal bonding between the frame member and the first substrate, and a second seal bonding material effecting seal bonding between the frame member and the second substrate. The composite member is composed of a first member, a first adhesive material bonding the first member and the first substrate to each other, and a second adhesive material bonding the first member and the second substrate to each other.

13 Claims, 5 Drawing Sheets

HERMETIC CONTAINER AND IMAGE DISPLAY APPARATUS

BACKGROUND OF THE INVENTION

1. Field of the Invention

The present invention relates to a hermetic container capable of maintaining a desired atmosphere therein, and particularly to an image display apparatus formed by using the hermetic container.

2. Related Background Art

Conventionally, in an image display apparatus utilizing a cold-cathode electron emitting device, there are opposed to each other, at a predetermined distance, a face plate equipped with an image forming member, such as a fluorescent screen, and an electron acceleration electrode, and a rear plate on which there is mounted an electron source equipped with a plurality of cold-cathode electron emitting devices, and a frame portion is arranged in the peripheral edge portion of these plates, forming a hermetic envelope composed of the face plate, the rear plate, and the frame portion. More specifically, Japanese Patent Application Laid-open No. H8-083578, for example, discloses an image display apparatus using a surface conduction electron-emitting device.

In the construction of the above-mentioned frame portion, a frame member (glass member) is bonded to the plates by using frit (low melting point glass) as a seal bonding material.

International Publication No. WO 00/51155 discloses a frame portion in which In, which is a low melting point metal, is used as the seal bonding material, the periphery of the seal bonding material and the frame member being covered with an adhesive material. FIG. 6 schematically shows the construction of the frame portion. FIG. 6 is a schematic sectional view of a portion around the frame portion disclosed in the above publication; in the drawing, reference numeral 1 indicates a face plate, reference numeral 2 indicates a rear plate, reference numeral 6 indicates an electron source, reference numeral 60 indicates the frame portion, reference numeral 61 indicates the frame member, reference numerals 62 and 63 each indicate the seal bonding material, and reference numeral 64 indicates the adhesive material.

The seal bonding materials 62 and 63, forming the frame portion 60, consist of In shaped into an arbitrary form, such as wires or sheets; by heating them at a temperature of 160° C. or more, they are softened to bond the plates 1 and 2 and the frame member 61 to each other. The adhesive material 64 fills the gap between the plates 1 and 2 so as to cover the seal bonding materials 62 and 63 and the frame member 61. Thus, in this construction, the bonding of the frame portion and the plates can be effected in a satisfactory manner at a temperature below 400° C.

Japanese Patent Application Laid-open No. 2000-311630 discloses a flat panel image display apparatus equipped with a vacuum container; disclosed therein is a construction having a plurality of frame members.

SUMMARY OF THE INVENTION

It is an object of the present invention to realize a hermetic container capable of realizing airtightness in a satisfactory manner; more specifically, it is an object of the present invention to realize a hermetic container resistant to changes in temperature. Another object of the present invention is to realize a preferable image display apparatus by using such a hermetic container.

According to a first aspect of the present invention, there is provided a hermetic container including: a first substrate; a second substrate opposed to the first substrate; a frame arranged between the first substrate and the second substrate; and a composite member arranged between the first substrate and the second substrate, in which the frame is composed of a frame member, a first seal bonding material effecting seal bonding between the frame member and the first substrate, and a second seal bonding material effecting seal bonding between the frame member and the second substrate, in which the composite member is composed of a first member, a first adhesive material bonding the first member and the first substrate to each other, and a second adhesive material bonding the first member and the second substrate to each other, and in which a modulus of rigidity of the first member is larger than a modulus of rigidity of at least one of the first adhesive material and the second adhesive material, and a combined shear rigidity of the composite member in a straight line which is parallel to a first plane, which is a surface of the first substrate opposed to the second substrate, and which extends in a direction perpendicular to a longitudinal direction of the frame member, is higher than a combined shear rigidity of the frame in the straight line.

According to a second aspect of the present invention, there is provided a hermetic container including: a first substrate; a second substrate opposed to the first substrate; a frame arranged between the first substrate and the second substrate; and a composite member arranged between the first substrate and the second substrate, in which the frame is composed of a frame member, a first seal bonding material effecting seal bonding between the frame member and the first substrate, and a second seal bonding material effecting seal bonding between the frame member and the second substrate, in which the composite member is composed of a first member, a first adhesive material bonding the first member and the first substrate to each other, and a second adhesive material bonding the first member and the second substrate to each other, and in which a modulus of rigidity of the first adhesive material is larger than a modulus of rigidity of the first seal bonding material, and/or a modulus of rigidity of the second adhesive material is larger than a modulus of rigidity of the second seal bonding material, with an average thermal expansion coefficient of the composite member being matched with an average thermal expansion coefficient of the frame within a range of $\pm 3 \times 10^{-6}/°$ C.

According to a third aspect of the present invention, there is provided a hermetic container including: a first substrate; a second substrate opposed to the first substrate; a frame arranged between the first substrate and the second substrate; and a composite member arranged between the first substrate and the second substrate, in which the frame is composed of a frame member, a first seal bonding material effecting seal bonding between the frame member and the first substrate, and a second seal bonding material effecting seal bonding between the frame member and the second substrate, in which the composite member is composed of a first member, a first adhesive material bonding the first member and the first substrate to each other, and a second adhesive material bonding the first member and the second substrate to each other, and in which a modulus of rigidity of the first adhesive material is larger than a modulus of rigidity of the first seal bonding material, and/or a modulus of rigidity of the second adhesive material is larger than a modulus of rigidity of the second seal bonding material, with an average thermal expansion coefficient of the composite member being matched with an average thermal expansion coefficient of the frame within a range of ±25%.

Regarding the hermetic containers according to the first through third aspects of the invention, the following features are included as preferred embodiments.

At least one of the first seal bonding material and the second seal bonding material includes one of a low melting point metal, a low melting point alloy, and frit.

At least one of the first adhesive material and the second adhesive material is formed by one of an organic adhesive and an inorganic adhesive.

The frame has a rectangular configuration, and a hermetic space is formed by the rectangular frame, the first substrate, and the second substrate. The composite member is arranged in correspondence with each side of the rectangular frame.

The composite member has a frame-like configuration.

The composite member is provided on an outer side of a hermetic space formed by the frame, the first substrate, and the second substrate.

A distance between the first member and the frame member in the straight line is not more than ten times a distance between the first substrate and the second substrate at a position where the frame is provided.

A height of the frame is equal to a height of the composite member.

According to a fourth aspect of the present invention, there is provided an image display apparatus using the hermetic container according to the present invention, in which a display device is provided in the hermetic container.

Further, in the image display apparatus according to the fourth aspect of the present invention, the display device has an electron-emitting device and a light emitting member caused to emit light by an electron emitted from the electron-emitting device.

BRIEF DESCRIPTION OF THE DRAWINGS

FIGS. 2A-1, 2A-2, 2B-1, 2B-2, 2C-1, and 2C-2 are model diagrams for illustrating combined shear rigidity in the present invention;

DESCRIPTION OF THE PREFERRED EMBODIMENTS

In the following embodiment of the present invention, which aims to realize a hermetic container capable of maintaining airtightness in a satisfactory manner, there is realized a construction in which it is possible to restrain, in a satisfactory manner, displacement in shearing direction, in particular, in a portion where a frame is provided, by providing a composite member constituting a reinforcing portion. In particular, by providing a composite member whose combined shear rigidity is larger than that of the frame, the composite member serves as the reinforcing portion, making it possible to restrain in a satisfactory fashion displacement in shearing direction, in particular, in the portion where the frame is provided.

Figure 6:
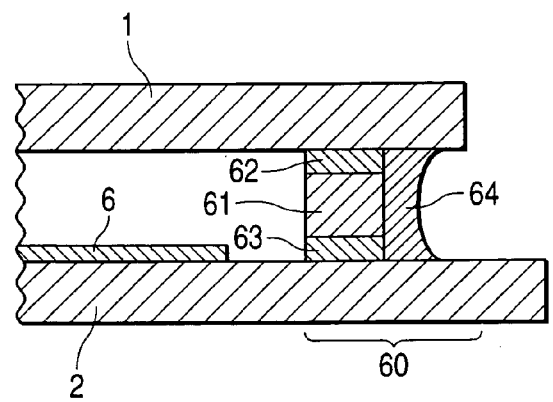
FIG. 6 is a schematic sectional view of a conventional image display apparatus, showing a portion around the frame thereof.

This will be illustrated with reference to FIG. 6 by way of example. When an image display apparatus is operated to form an image, heat is generated in a fluorescent screen (not shown) belonging to an electron source 6 or a face plate 1, and an increase in temperature occurs; due to a difference in heat generation amount between the electron source 6 and the fluorescent screen, or due to a difference in heat dissipation environment between a rear plate 2 and the face plate 1, a difference in temperature is generated between the region of the face plate 1 where the fluorescent screen is arranged and the region of the rear plate 2 where the electron source 6 is arranged. Due to this difference in temperature, a difference in thermal expansion amount is generated between the face plate 1 and the rear plate 2, and the difference in thermal expansion amount is applied as shearing stress to a frame portion 60, which is a peripheral edge portion of an envelope. In particular, when seal bonding materials 62 and 63 maintaining airtightness are formed of a relatively soft material, such as a low melting point metal or a low melting point alloy, a shear rigidity is required which will cause no great deformation in the seal bonding portion. In the embodiment described below, a composite member whose combined shear rigidity (the term combined shear rigidity will be illustrated below) is larger than that of the frame is provided as a reinforcing portion, making it possible to prevent generation of great deformation in the seal bonding portion.

The construction of the following embodiment is common to that of second and third embodiments of the present invention. Referring again to FIG. 6, as a result of a temperature rise in a casing of the image display apparatus due to heat generation at the time of image formation and heat generation of a drive circuit (not shown), generation of changes in temperature due to the ambient temperature outside the casing of the image display apparatus, etc., there is generated thermal deformation due to a difference in thermal expansion coefficient between the frame, which is formed by a frame member 61 and the seal bonding materials 62 and 63, and an adhesive material 64. Since higher strength and higher rigidity are required of the adhesive material 64, the seal bonding materials 62 and 63 bear all the burden of the thermal deformation (thermal expansion/contraction) of the adhesive material 64. When the average thermal expansion coefficient of the portion between the face plate 1 and the rear plate 2 greatly differs between the frame formed by the seal bonding materials 62 and 63 and the frame member 61 and a reinforcing structure portion formed by the adhesive material 64, there is generated in the seal bonding materials 62 and 63 a tensile stress in the thickness direction (tearing stress in the thickness direction) or a compressive stress (thickness crushing stress).

Here, when, as the adhesive material of the reinforcing portion, there is adopted one whose modulus of rigidity is larger than that of the seal bonding material of the frame, it becomes easier to realize a construction restraining displacement in shearing direction of the seal bonding portion of the frame; however, an attempt to realize the reinforcing portion solely by an adhesive material makes it difficult to restrain within a predetermined value range or to a predetermined proportion the difference between the thermal expansion coefficient of the adhesive material and the average thermal expansion coefficient of the frame (which is the thermal expansion coefficient of the frame formed by the frame member and the seal bonding material and will be illustrated in detail below). In the embodiment described below, the reinforcing portion is formed as a composite member consisting of a combination of a first member constituting the reinforcing member and an adhesive material, whereby a construction is easily realized in which it is possible to restrain the difference between the average thermal expansion coefficient of the composite member constituting the reinforcing portion and the average thermal expansion coefficient of the frame.

Figure 1:
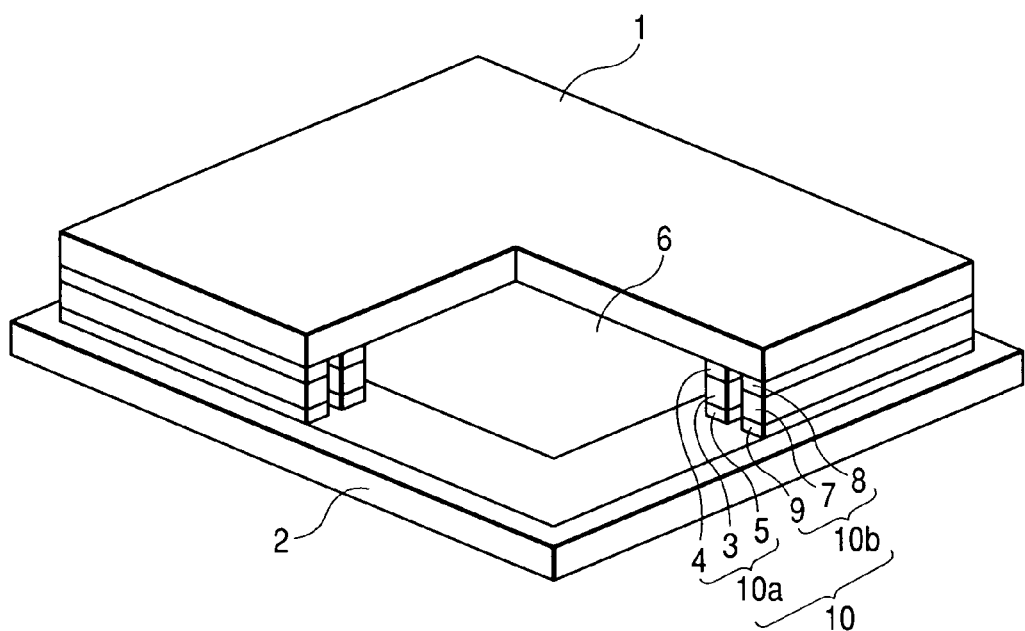
FIG. 1 is a perspective view of an example of an image display apparatus according to the present invention.
Figure 4:
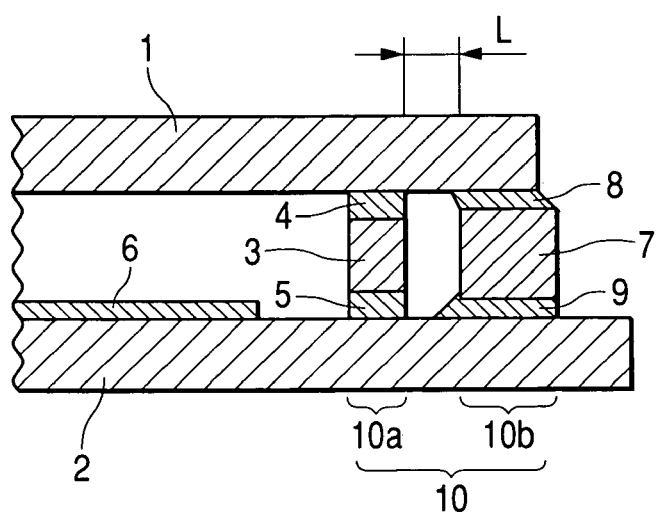
FIG. 4 is a schematic sectional view of an image display apparatus of the present invention, showing a portion around the frame thereof.

FIG. 1 is a perspective view of an example of an image display apparatus formed by using a hermetic container according to the present invention. In FIG. 1, which schematically shows the construction of the image display apparatus, one of the plates is partially cut away. FIG. 4 is a schematic sectional view of a portion of FIG. 1 around the frame 10a. In the drawings, reference numeral 1 indicates a face plate, reference numeral 2 indicates a rear plate, reference numeral 3 indicates a frame member, reference numeral 4 indicates a first seal bonding material, reference numeral 5 indicates a second seal bonding material, reference numeral 6 indicates an electron source, reference numeral 7 indicates a rigid member constituting the first member, reference numeral 8 indicates a first adhesive material, reference numeral 9 indicates a second adhesive material, reference numeral 10 indicates a reinforcing frame structure consisting of a frame structure reinforced by a composite member, reference symbol 10a indicates a frame, and reference symbol 10b indicates the composite member constituting the reinforcing portion.

In the construction shown in FIG. 1, the substrate forming the face plate 1 corresponds to the first substrate of the present invention, and the rear plate 2 corresponds to the second substrate. Usually, the face plate 1 has, on an inner surface of a glass substrate, a fluorescent screen (not shown) and a metal back (not shown) and, further, a transparent electrode as needed. Mounted on the rear plate 2 is the electron source 6, which has a plurality of electron-emitting devices respectively constituting display devices, and the electron-emitting devices are connected to matrix wiring or ladder-like wiring belonging to the rear plate 2. The face plate 1 and the rear plate 2 are opposed to each other at a predetermined distance through the intermediation of a spacer (not shown) as needed, and are bonded together through the intermediation of the frame 10a in the peripheral edge portion to form a hermetic container.

In the image display apparatus of FIG. 1, the wiring of the electron source 6 is appropriately selected to cause electrons to be emitted from a predetermined device, and, at the same time, high voltage is applied to the metal back or the transparent electrode (not shown), accelerating an electron beam emitted from the device. The accelerated electrons collide with the fluorescent screen to effect light emission, thereby forming an image.

In the hermetic container of the present invention, the reinforcing frame structure 10 is composed of the frame 10a and the composite member 10b, and the frame 10a is formed by bonding the frame member 3 to the face plate 1 and the rear plate 2 by the first seal bonding material 4 and the second seal bonding material 5, respectively. That is, the frame 10a is composed of the first seal bonding material in hermetically close contact with the first substrate, the second seal bonding material in hermetically close contact with the second substrate, and the frame member. The composite member 10b is formed by bonding the rigid member 7 constituting the first member to the face plate 1 and the rear plate 2 by the first adhesive material 8 and the second adhesive material 9, respectively. That is, the composite member 10b is composed of the first adhesive material forming the bond to the first substrate, the second adhesive material forming the bond to the second substrate, and the first member.

In the hermetic container of the present invention, the first substrate and the second substrate can be preferably formed of glass substrates. For example, high strain point glass, soda lime glass, or silica glass can be preferably used. Further, it is also possible to use a substrate, such as a glass substrate, with a desired coating as the first substrate or the second substrate.

As the frame member 3, a glass member of a material similar to that of the first substrate and the second substrate is preferably used. As the rigid member 7 constituting the first member, there is used a member formed of a material having a modulus of rigidity larger than that of at least one of the first and second adhesive materials 8 and 9; preferably, a glass member is used. Alternatively, a ceramic member or the like is used. Further, as the first and second seal bonding materials 4 and 5, a low melting point metal such as In, Bi, Pb, Sn, or Cd, or a low melting point alloy including such a low melting point metal is preferably used; frit is also preferably used. As the first and second adhesive materials 8 and 9, an organic type adhesive, such as a thermosetting resin adhesive like epoxy type adhesive, photosensitive adhesive, instant setting adhesive, or thermoplastic adhesive is preferably used; apart from this, an inorganic adhesive containing alumina, silica, zirconium, or carbon as a main component may also be preferably used.

It is to be noted that, in the present invention, the first seal bonding material 4 and the second seal bonding material 5 may be the same or different from each other. Further, the first adhesive material 8 and the second adhesive material 9 may be the same or different from each other. Here, the seal bonding material is a material capable of realizing a hermetic close contact state. As for the first adhesive material 8 and the second adhesive material 9, it is not necessary for them to be capable of realizing hermetic adhesion; it is only necessary for them to be capable of realizing adhesion.

As the electron-emitting devices, surface conduction electron-emitting devices are preferably used; apart from this, field emission type devices and cold-cathode electron-emitting devices using carbon nanotubes can be preferably used.

As for the method of manufacturing the hermetic container of the present invention, it is possible to apply a conventional hermetic container manufacturing method as it is except for the composite member 10b. Regarding the composite member 10b, as specifically shown with reference to Examples described below, one adhesive material is applied to one substrate using a dispenser or the like, and the rigid member is forced in to effect bonding, and then the other adhesive material is applied between the rigid member and the other substrate for bonding.

In the following, a plurality of embodiments of the present invention will be described specifically; one of the features of these embodiments is that, in the reinforcing frame structure composed of the frame and the reinforcing portion, the reinforcing portion is not composed of a single material, but a combination of the first member, which is a member separate from the frame member, and the adhesive materials, that is, a composite member. That is, the reinforcing portion is formed as a composite material composed of a combination of the first member, which has a modulus of rigidity larger than that of at least one of the adhesive materials, and the adhesive materials, whereby it is possible to enhance the combined shear rigidity of the reinforcing portion, which is composed of the adhesive materials bonded to the first and second substrates and the first member, as compared with the case in which it is solely composed of an adhesive material.

Further, as stated above, from the viewpoint of the average thermal expansion coefficients of the frame and the reinforcing portion between the first substrate and the second substrate, when the reinforcing portion is formed of a single material, the average thermal expansion coefficient of the reinforcing portion is the thermal expansion coefficient of that single material. An attempt to match this thermal expansion coefficient with the average thermal expansion coefficient of the frame within a desired range would result in difficulty in properly selecting the materials forming the reinforcing portion. By forming the reinforcing portion as a composite member composed of the adhesive materials and the reinforcing member combined together, the following advantages can be attained:

(1) In the case in which an adhesive material whose thermal expansion coefficient is larger than the average thermal expansion coefficient of the frame is used in the reinforcing portion, it is possible to make the average thermal expansion coefficient of the composite member smaller than the thermal expansion coefficient of the adhesive material by using a first member which has a thermal expansion coefficient smaller than the average thermal expansion coefficient of the frame.

(2) In the case in which an adhesive material whose thermal expansion coefficient is smaller than the average thermal expansion coefficient of the frame is used in the reinforcing portion, it is possible to make the average thermal expansion coefficient of the composite member larger than the thermal expansion coefficient of the adhesive material by using a first member which has a thermal expansion coefficient larger than the average thermal expansion coefficient of the frame.

When the above conditions (1) and (2) are adopted, it becomes very easy to set the relationship between the average thermal expansion coefficient of the frame and the average thermal expansion coefficient of the reinforcing portion to a desired relationship. In particular, it is desirable that the average thermal expansion coefficient of the composite member $10b$ coincide with the average thermal expansion coefficient of the frame $10a$ within a range of $\pm 3 \times 10^{-6}/°C$. (a second aspect of the invention), and/or that the average thermal expansion coefficient of the composite member $10b$ coincide with the average thermal expansion coefficient of the frame $10a$ within a range of $\pm 25\%$ (a third aspect of the invention).

In the following, the shear rigidity and the average thermal expansion coefficient in the present invention will be defined.

(Shear Rigidity)

Shear rigidity will be discussed with reference to FIGS. 2A-1, 2A-2, 2B-1, 2B-2, 2C-1, and 2C-2.

Figures 1, 2A:
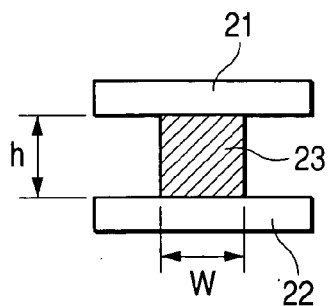
Figures 2, 2A:
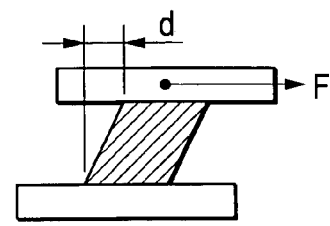
Figures 1, 2B:
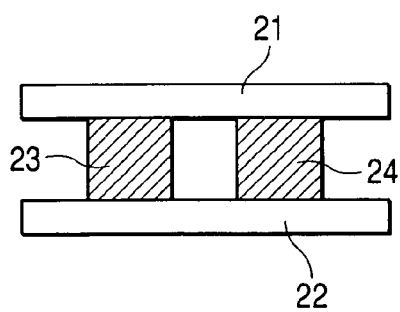
Figures 2, 2B:
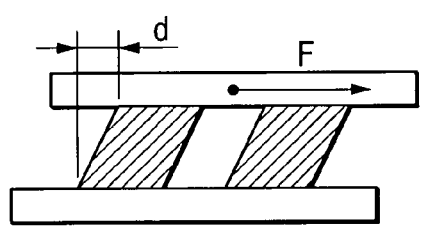

Substrates 21 and 22 are arranged in parallel, and there is arranged between them a member 23 having a modulus of rigidity G, a width W, and a thickness h (FIG. 2A-1). A general shear rigidity S when a shear load F is applied to the substrate 21 to displace it by a distance d, with the substrate 22 being fixed, is defined by the following equation (1). It is to be noted that the dimension perpendicular to the plane of the drawing corresponds to unit length.

$$F=(G \times W/h) \times d = S \times d \quad (1)$$

Next, utilizing the shear rigidity as defined by the above equation (1), the apparent shear rigidity when two members are arranged in parallel is defined. The substrates 21 and 22 are arranged in parallel, and there are arranged side by side between them the member 23 having a shear rigidity $S_1$ and a member 24 having a shear rigidity $S_2$ (FIG. 2B-1) Suppose the dimension perpendicular to the plane of the drawing corresponds to the unit length. Here, when the shear load F is applied to the substrate 21 to displace it by a distance d, with the substrate 22 being fixed (FIG. 2B-2), the following equation (2) holds true. That is, the apparent shear rigidity (the combined shear rigidity of the members 23 and 24) S is $(S_1+S_2)$.

$$F=(S_1+S_2) \times d = S \times d \quad (2)$$

Figures 1, 2C:
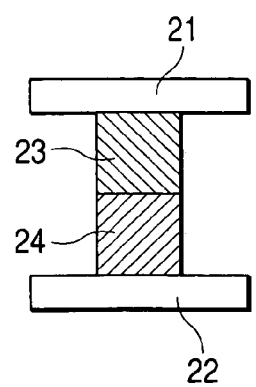
Figures 2, 2C:
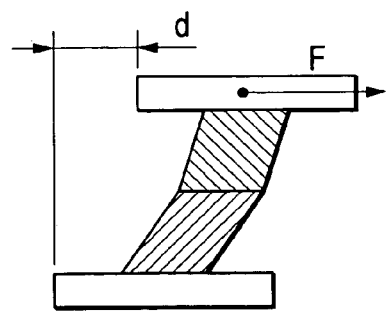

Next, the apparent shear rigidity when two members are arranged in series will be defined. The substrates 21 and 22 are arranged in parallel, and there are stacked together between them the member 23 having the shear rigidity $S_1$ and the member 24 having the shear rigidity $S_2$ (FIG. 2C-1). Suppose the dimension perpendicular to the plane of the drawing corresponds to the unit length. Here, when the shear load F is applied to the substrate 21 to displace it by a distance d, with the substrate 22 being fixed (FIG. 2C-2), the following equation (3) holds true, and the apparent shear rigidity (the combined shear rigidity of the members 23 and 24) S is $1/\{(1/S_1)+(1/S_2)\}$.

$$F=[1/\{(1/S_1)+(1/S_2)\}] \times d = S \times d \quad (3)$$

Here, assuming that the respective heights of the members are $h_1$ and $h_2$, and the respective moduli of rigidity of the members are $G_1$ and $G_2$, $S_1$ and $S_2$ can be expressed by the following equations:

$$S_1 = G_1 \times W/h_1$$

$$S_2 = G_2 \times W/h_2$$

Here, $h_1+h_2=h$.

The combined shear rigidity S when three members are arranged in series is expressed as follows: assuming that the third member has a modulus of rigidity $G_3$, a height $h_3$, and a shear rigidity $S_3=G_3 \times W/h_3$, $$S=1/\{(1/S_1)+(1/S_2)+(1/S_3)\} \quad (4)$$

On the basis of the above discussion, according to the first aspect of the present invention, there is assumed the presence of a straight line which is parallel to the surface of the first substrate opposed to the second substrate and which extends along a direction perpendicular to the longitudinal direction of the frame (the direction perpendicular to the plane of FIGS. 2A-1, 2A-2, 2B-1, 2B-2, 2C-1, and 2C-2) (It is a straight line which is in the plane of FIGS. 2A-1, 2A-2, 2B-1, 2B-2, 2C-1, and 2C-2 and which exhibits a horizontal direction); when the combined shear rigidity of the frame along the straight line (Since the frame member (with a shear rigidity $S_2$) forming the frame and the seal bonding materials (with shear rigidities $S_1$ and $S_3$) for seal-bonding the frame member onto each of the first substrate and the second substrate are arranged in series, it is possible to obtain the combined shear rigidity from the above equation (4)) is compared with the combined shear rigidity of the composite member extending along the straight line (which, like the combined shear rigidity of the frame portion, can be obtained by the above equation (4) from the shear rigidities of the first member and the adhesive material), it is desirable that the combined shear rigidity of the composite member be higher than the combined shear rigidity of the frame.

When, as in the case of the composite member 10b shown in FIG. 4, the contact width between the adhesive material (e.g., the first adhesive material 8) and the substrate (face plate 1) and the contact width between the adhesive material and the first member 7 are different from each other, the average value of the contact widths is regarded as the substantial width of the first adhesive material, and is defined as the width W used for calculating shear rigidity.

Further, when the difference between the contact width with respect to the substrate and the contact width with respect to the first member is four times or more as large as the thickness of the adhesive material, a width obtained by adding four times the thickness of the adhesive material to the smaller of the contact width with respect to the substrate and the contact width with respect to the first member is regarded as the substantial width, and is used as the width for calculating shear rigidity.

When the distance between the frame and the composite member becomes too large, the displacement restraining effect for the frame installation position due to the composite member is reduced, so that it is desirable for the distance (L) between the frame and the composite member to be ten times or less the distance between the first substrate and the second substrate at the position where the frame is provided.

While in the above-described example the widths and heights of the members 33, 34, and 35 are uniform in different portions of the members 33, 34, and 35, they may not be uniform in some cases. In such cases, average values are used. For example, when the width of the member 33 is not uniform, the average value thereof is regarded as the width, and when the height thereof is not uniform, the average value thereof is regarded as the height. When the width of a member is not uniform in the height direction, the value obtained by dividing the value obtained through integration of the width in the height direction by the integration range is regarded as the average value of the width of this member. When the height of a member is not uniform in the width direction, the value obtained by dividing the value obtained through integration of the height in the width direction by the integration range is regarded as the average value of the height of this member. The combined shear rigidity increases as the width increases, so that when the combined shear rigidity determined by the shear rigidities of the members obtained with respect to a part of the composite member in the width direction under the above condition is higher than the composite shear rigidity of the frame, the combined shear rigidity of the entire composite member is higher than the combined shear rigidity of the frame.

(Average Thermal Expansion Coefficient)

Figure 3:
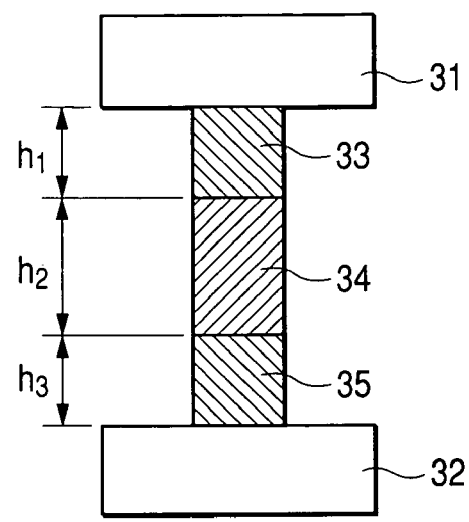
FIG. 3 is a model diagram for illustrating an average thermal expansion coefficient in the present invention.

Average thermal expansion coefficient will be discussed with reference to FIG. 3.

The substrates 31 and 32 are arranged in parallel, and there are stacked together between them the member 33 having a thermal expansion coefficient $\alpha_1$ and a thickness $h_1$, the member 34 having a thermal expansion coefficient $\alpha_2$ and a thickness $h_2$, and the member 35 having a thermal expansion coefficient $\alpha_3$ and a thickness $h_3$. In this case, the average thermal expansion coefficient a between the substrates 31 and 32 is defined by the following equation (5):

$$\alpha=(\alpha_1 h_1+\alpha_2 h_2+\alpha_3 h_3)/(h_1+h_2+h_3) \qquad (5)$$

While combined shear rigidity and average thermal expansion coefficient are defined in the above discussion while restricting the number of members, the same principle is also applicable when the number of members is increased, making it possible to define combined shear rigidity and average thermal expansion coefficient.

Here, a construction will be considered in which the thermal expansion coefficients of the frame and the reinforcing portion are matched with each other within the above preferable range, making it possible to achieve the reinforcing effect in a satisfactory manner. To achieve the reinforcing effect in a satisfactory manner, it is desirable to use a material with a large modulus of rigidity in the reinforcing portion. However, when a material with a large modulus of rigidity is used singly, it is difficult to satisfy the condition for matching the average thermal expansion coefficients of the frame and the reinforcing portion within the range of the second or third aspect of the invention. In view of this, according to one aspect of the present invention, a composite member is adopted as the reinforcing portion, thereby realizing a construction which easily allows matching of the average thermal expansion coefficients under the above condition; further, the modulus of rigidity of the adhesive material forming the composite member is larger than the modulus of rigidity of the corresponding seal bonding material, thereby realizing a satisfactory reinforcement.

EXAMPLE 1

An image display apparatus according to the present invention was prepared by the process shown in FIGS. 5A, 5B, 5C, and 5D.

Figure 5A:
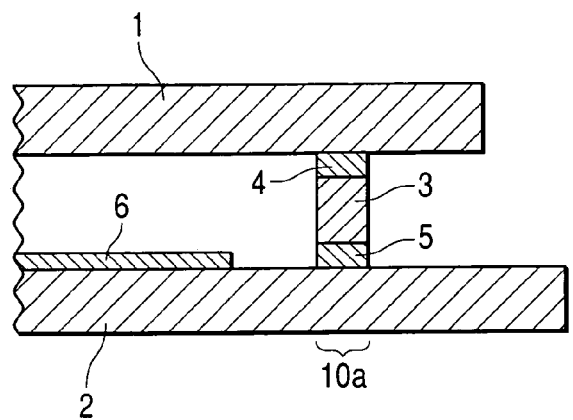
FIGS. 5A, 5B, 5C, and 5D are diagrams showing reinforcing portion forming processes according to an embodiment of the present invention.

First, by the manufacturing method as disclosed in Japanese Patent Application Laid-open No. 2001-210258, etc., a fluorescent screen and a metal back were formed on the inner surface of a high strain point glass plate to thereby prepare the face plate 1, and the electron source 6 equipped with surface conduction electron-emitting devices was mounted on the rear plate 2 consisting of a high strain point glass; the two plates were opposed to each other through a gap of 1.6 mm, and bonding was effected in the peripheral edge portion by the frame 10a (FIG. 5A).

The first seal bonding material 4 forming the frame 10a consists of In, which is a low melting point metal, and has a thickness of 0.3 mm, a width of 5 mm, a modulus of rigidity of 0.8 GPa, and a thermal expansion coefficient of $26\times10^{-6}/°$ C. Thus, the shear rigidity of the first seal bonding material 4 is 13 GPa.

The frame member 3 is a glass member and has a thickness of 1.2 mm, a width of 5 mm, a modulus of rigidity of 32 GPa, and a thermal expansion coefficient of $8\times10^{-6}/°$ C. Thus, the shear rigidity of the frame member 3 is 133 GPa.

Further, the second seal bonding material 5 is formed of a low melting point glass, and has a thickness of 0.1 mm, a width of 5 mm, a modulus of rigidity of 22 GPa, and a thermal expansion coefficient of $7\times10_{-6}/°$ C. Thus, the shear rigidity of the frame member 3 is 1100 GPa.

Thus, from the above equation (4), the frame 10a has a combined shear rigidity of 12 GPa and an average thermal expansion coefficient of $11\times10^{-6}/°$ C.

Figure 5B:
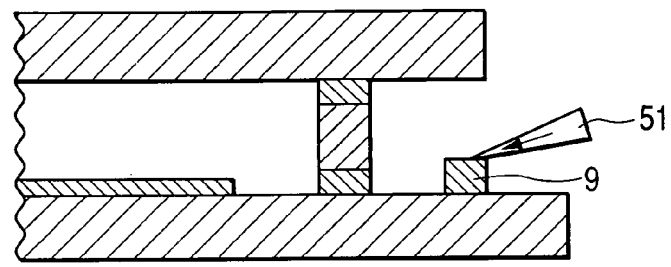

Next, an epoxy type adhesive material constituting the second adhesive material 9 was applied in an appropriate amount to the rear plate 2 by using a dispenser 51 such that it does not come into contact with the frame 10a (FIG. 5B).

Figure 5C:
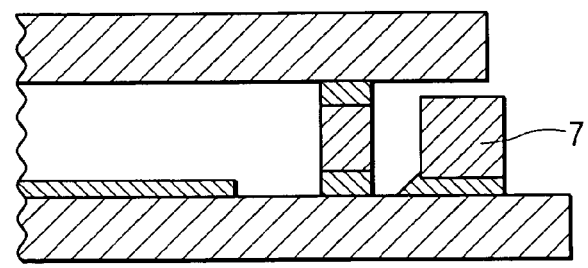

Next, a glass member constituting the rigid member 7 serving as the first member was forced into the applied second adhesive material 9 such that it does not come into contact with the frame 10a (FIG. 5C). In the construction of FIG. 4, the distance between the frame and the composite member is L. The glass member serving as the rigid member 7 was obtained by cutting from the same high strain point glass as that used for the face plate 1. The gap between the rigid member 7 and the face plate 1 was 0.03 mm.

Figure 5D:
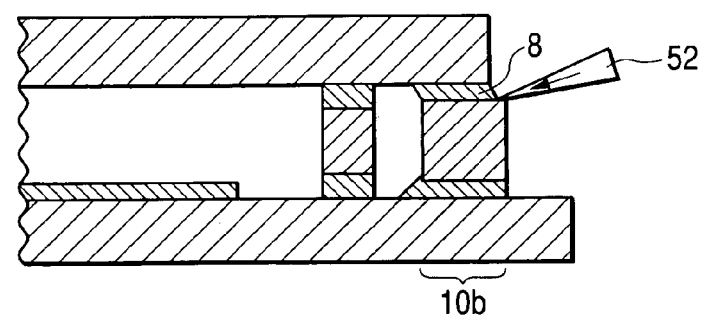

An epoxy type adhesive material constituting the first adhesive material 8 was applied to the gap between the rigid member 7 and the face plate 1 by using a dispenser 52 such that it does not come into contact with the frame 10a. In this process, the application pressure of the dispenser 52 was set relatively high to force the adhesive material into the gap. Thereafter, the adhesive material was left to stand for twelve hours to cure the same, thus obtaining the first and second adhesive materials 8 and 9. In this way, the composite member 10b constituting the reinforcing portion was formed (FIG. 5D). Here, the distance between the frame and the composite member is adjusted to 2 mm. The distance between the frame and the composite member is defined as the shortest distance between one of the point at which the frame member is in contact with the first adhesive material and the point at which the frame member is in contact with the second adhesive material and one of the point at which the first member is in contact with the first seal bonding material and the point at which the first member is in contact with the second seal bonding material.

The combined shear rigidity and the average thermal expansion coefficient of the composite member 10b are as follows.

The first adhesive material 8 has a thickness of 0.03 mm, a width of 2.8 mm, a modulus of rigidity of 1 GPa, a thermal expansion coefficient of $20 \times 10^{-6}/°$ C., and a shear rigidity of 93 GPa.

The rigid member 7 has a thickness of 1.53 mm, a width of 2.8 mm, a modulus of rigidity of 32 GPa, a thermal expansion coefficient of $8 \times 10^{-6}/°$ C., and a shear rigidity of 59 GPa.

The second adhesive material 9 has a thickness of 0.04 mm, a width of 2.8 mm, a modulus of rigidity of 1 GPa, a thermal expansion coefficient of $120 \times 10^{-6}/°$ C., and a shear rigidity of 70 GPa.

Thus, the composite member 10b has a combined shear rigidity of 24 GPa and an average thermal expansion coefficient of $13 \times 10^{-6}/°$ C.

As stated above, in this example, regarding the first aspect of the invention, the combined shear rigidity is 12 GPa in the frame 10a and 24 GPa in the composite member 10b constituting the reinforcing portion. That is, by using a first member having a modulus of rigidity larger than that of the adhesive material, a composite member serving as the reinforcing portion is realized which has a combined shear rigidity higher than that of the frame.

Here, a case will be considered in which the reinforcing portion is formed solely of the above adhesive material with a width of 2.8 mm; in this case, the combined shear rigidity of the reinforcing portion (which is the shear rigidity of the adhesive material since only adhesive material is used in this case) is 1.8 GPa, which means the combined shear rigidity of the reinforcing portion is lower than that of the frame. Regarding the first aspect of the invention, by using a first member of a different material from the frame member or by making the height of the frame member different from the height of the first member, it is possible to realize a reinforcing portion whose combined shear rigidity is higher than that of the frame even when the modulus of rigidity of the adhesive material is not larger than that of the seal bonding material on both the first substrate side and the second substrate side; however, it is desirable, as in this example, to use an adhesive material with a modulus of rigidity larger than that of the seal bonding material on at least one of the first substrate side and the second substrate side (in particular, on the substrate side where a seal bonding material with a relatively small modulus of rigidity such as In or an alloy containing In is used).

Further, regarding the second and third aspects of the invention, on the first substrate side, the modulus of rigidity of the adhesive material 8 is larger than that of the seal bonding material 4, and the average thermal expansion coefficient is $11 \times 10^{-6}/°$ C. in the frame 10a, whereas it is $13 \times 10^{-6}/°$ C. in the composite member 10b. That is, regarding the average thermal expansion coefficient, matching with the frame 10a is effected within ranges of $\pm 3 \times 10^{-6}/°$ C. and ±25%. Here, a case will be considered in which the reinforcing portion is formed solely by the adhesive material 8; in this case, the average thermal expansion coefficient of the reinforcing portion is the thermal expansion coefficient of the adhesive material, which is $120 \times 10^{-6}/°$ C., i.e., a value greatly deviated from the average thermal expansion coefficient of the frame. Regarding the second and third aspects of the invention, it is not essential that the combined shear rigidity of the composite member be higher than that of the frame; however, it is desirable that, as in this example, the combined shear rigidity of the composite member be higher than that of the frame.

A vacuum exhaust pipe (not shown) provided on a hermetic container with the completed reinforcing frame structure 10 was mounted to an external vacuum exhaust apparatus (not shown), and the pressure inside the hermetic container was adjusted to $1 \times 10^{-3}$ Pa or less; then, as disclosed in Japanese Patent Application Laid-open No. H8-083578, an energization operation, such as forming operation or activation operation, was performed on the electron source 6, and then the vacuum exhaust pipe was sealed up by heating with a burner, thereby completing a container substantially in a vacuum state.

Further, there were mounted a drive device, such as a drive board, for driving the electron source 6, a high voltage power source supplying high voltage for accelerating electrons emitted from the electron source 6, thus preparing an image display apparatus.

By using the above image display apparatus, an image was formed on the face plate 1; as a result of the image formation, the temperature of the face plate 1 became higher than that of the rear plate by an average of 10° C.; however, there was no change in the positional relationship between the face plate 1 and the rear plate 2, and no deterioration in image quality was to be observed.

Further, durability test was conducted on the above image display apparatus in a thermostatic chamber in which temperature change was repeatedly effected between −10° C. and 50° C.; no reduction in luminance occurred, and, accordingly, no slow leakage was generated, making is possible to ensure reliability.

Further, in this example, the composite member 10b is spaced apart from the frame 10a by L=2 mm, the thickness H of the face plate 1 and the rear plate 2 is 2.8 mm, the Young's modulus E=78 GPa, and a substrate gap t between the face plate 1 and the rear plate 2 is 1.6 mm, so that the stress generated in the bonding portions of the frame 10a, the face plate 1, and the rear plate 2 by a temperature change δT=30° C. can be derived from the following equation (6), to which the beam theory of strength of materials is applied:

$$\delta = (3HE/2L^2) \times (\delta\alpha \times \delta T \times t/2) \quad (6)$$

Experience shows that the value not involving generation of slow leakage, $\delta_0=6$ MPa, and that it is only necessary for the average thermal expansion coefficient δα of the composite member 10b with respect to the frame 10a, satisfying the above equation, to be within the range of $\pm 3 \times 10^{-6}/°$ C. Thus, the average thermal expansion coefficient of the composite member 10b with respect to the frame 10a whose average thermal expansion coefficient is $11 \times 10^{-6}/°$ C. ranges from $8 \times 10^{-6}$ to $14 \times 10^{-6}/°$ C. To confirm this, an image display apparatus was formed, varying the thickness of the first member 7 from 1.58 to 1.52 mm; the result showed that no problem is involved as long as the average thermal expansion coefficient of the composite member 10b is within the range of $\pm 3 \times 10^{-6}/°$ C. with respect to the frame 10a.

Further, even if there is some change in the above configuration, etc., it is to be assumed that no problem is involved as long as the average thermal expansion coefficient of the composite member 10b is within the range of +25% with respect to the frame 10a.

EXAMPLE 2

An image display apparatus was formed in the same manner as in Example 1 except that the first adhesive material 8 with a thickness of 0.04 mm was formed by using an instant setting adhesive. The average thermal expansion coefficient of the composite member 10b was the same as in Example 1, and a satisfactory result similar to that in Example 1 was obtained.

EXAMPLE 3

An image display apparatus was formed in the same manner as in Example 1 except that the construction of the composite member 10b was changed as follows.

The first adhesive material 8 was obtained by curing an inorganic type adhesive; it had a thickness of 0.1 mm, a width of 5 mm, a modulus of rigidity of 1 GPa, a thermal expansion coefficient of $120 \times 10^{-6}/°$ C., and a shear rigidity of 50 GPa.

The rigid member 7 was a no alkali glass member, and had a thickness of 1.1 mm, a width of 5 mm, a modulus of rigidity of 29 GPa, a thermal expansion coefficient of $5 \times 10^{-6}/°$ C., and a shear rigidity of 132 GPa.

The second adhesive material 9 was obtained by curing an epoxy type adhesive material; it had a thickness of 0.4 mm, a width of 5 mm, a modulus of rigidity of 2 GPa, a thermal expansion coefficient of $8 \times 10^{-6}/°$ C., and a shear rigidity of 25 GPa.

Thus, the composite member 10b had a combined shear rigidity of 15 GPa and an average thermal expansion coefficient of $13 \times 10^{-6}/°$ C.; as in Example 1, its average thermal expansion coefficient was within the ranges of $\pm 3 \times 10^{-6}/°$ C. and ±25% with respect to the frame 10a.

In the image display apparatus of this example also, the same satisfactory result as in Example 1 was obtained.

In the above-described examples, the frame has a rectangular configuration, and a hermetic space is formed by the rectangular frame and the first and second substrates, with the composite member constituting an outer frame surrounding the hermetic space on the outer side thereof, that is, with the frame constituting an inner frame. However, the embodiments of the present invention are not restricted to this configuration. It is to be noted, however, that it is desirable for a composite member satisfying the above condition to be provided at least one position of each of the sides forming the rectangular frame. Further, it is desirable for the composite member to be provided on the outer side of the hermetic space formed by the frame.

Figure 7:
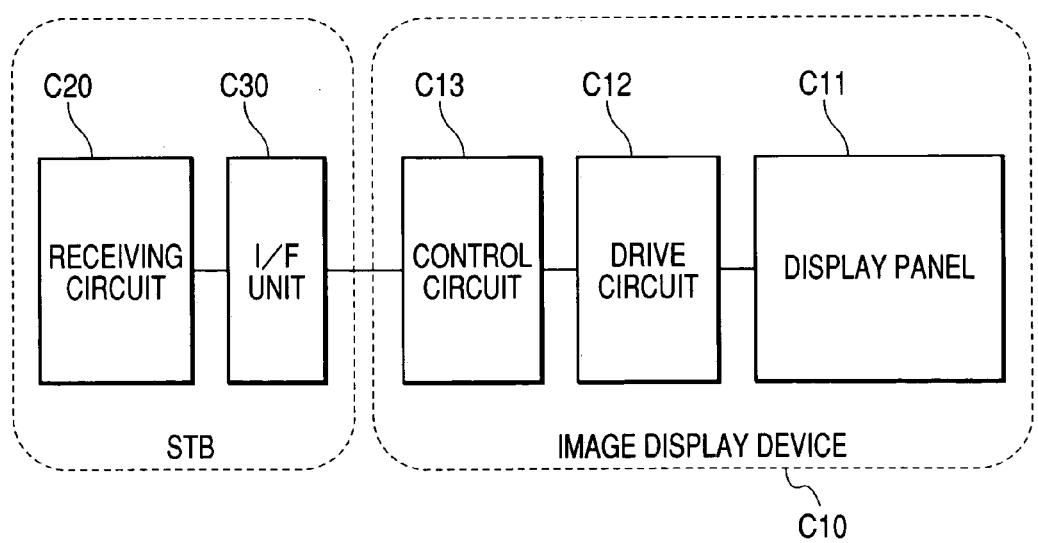
FIG. 7 is a block diagram of a TV apparatus using a hermetic container according to an embodiment of the present invention.

FIG. 7 is a block diagram of a TV apparatus according to an embodiment of the invention. A receiving circuit C20 is composed of a tuner, a decoder and so on. This receiving circuit C20 receives the TV signals of satellite broadcastings or ground waves and so on, and data broadcasting through networks, and outputs decoded video data to an I/F unit C30. This I/F unit C30 converts the video data into the display format of an image display device C10, and outputs the image data to the image display device C10. This image display device C10 is provided with a display panel C11 (This display panel is manufactured using the above described hermetic container.), drive circuits C12 and a control circuit C13. This control circuit C13 subjects the inputted image data to an image processing such as a correction processing suited for the display panel C11, and outputs the image data and various control signals to the drive circuits C12. The drive circuits C12 output drive signals to the display panel C11 on the basis of the image data inputted. As a result, the TV image is displayed in the display panel C11.

The receiving circuit C20 and I/F unit C30 may be put in a different case than that of the image display device C10 as a set top box (STB) or the case of the image display device C10.

This application claims priority from Japanese Patent Application No. 2003-317861 filed Sep. 10, 2003, which is hereby incorporated by reference herein.

What is claimed is:

1. A hermetic container comprising:
   a first substrate;
   a second substrate opposed to the first substrate;
   a frame arranged between the first substrate and the second substrate; and
   a composite member arranged between the first substrate and the second substrate,
   wherein the frame is composed of a frame member, a first seal bonding material effecting seal bonding between the frame member and the first substrate, and a second seal bonding material effecting seal bonding between the frame member and the second substrate,
   wherein the composite member is composed of a first member, a first adhesive material bonding the first member and the first substrate to each other, and a second adhesive material bonding the first member and the second substrate to each other, and
   wherein a modulus of rigidity of the first member is larger than a modulus of rigidity of at least one of the first adhesive material and the second adhesive material, and a combined shear rigidity of the composite member in a straight line which is parallel to a first plane, which is a surface of the first substrate opposed to the second substrate, and which extends in a direction perpendicular to a longitudinal direction of the frame member, is higher than a combined shear rigidity of the frame in the straight line.

2. A hermetic container according to claim 1, wherein at least one of the first seal bonding material and the second seal bonding material comprises one of a low melting point metal and a low melting point alloy.

3. A hermetic container according to claim 1, wherein at least one of the first seal bonding material and the second seal bonding material comprises frit.

4. A hermetic container according to claim 1, wherein at least one of the first adhesive material and the second adhesive material is formed by an organic adhesive.

5. A hermetic container according to claim 1, wherein at least one of the first adhesive material and the second adhesive material is formed by an inorganic adhesive.

6. A hermetic container according to claim 1, wherein the frame has a rectangular configuration, and wherein a hermetic space is formed by the rectangular frame, the first substrate, and the second substrate, the composite member being arranged in correspondence with each side of the rectangular frame.

7. A hermetic container according to claim 6, wherein the composite member has a frame-like configuration.

8. A hermetic container according to claim 1, wherein the composite member is provided on an outer side of a hermetic space formed by the frame, the first substrate, and the second substrate.

9. A hermetic container according to claim 1, wherein a distance between the first member and the frame member in the straight line is not more than ten times a distance between the first substrate and the second substrate at a position where the frame is provided.

10. A hermetic container according to claim 1, wherein a height of the frame is equal to a height of the composite member.

11. An image display apparatus using the hermetic container according to claim 1, wherein a display device is provided in the hermetic container.

12. An image display apparatus according to claim 11, wherein the display device has an electron-emitting device and a light emitting member caused to emit light by an electron emitted from the electron-emitting device.

13. A TV apparatus comprising:

a tuner; and an image display apparatus prepared according to claim 11 for displaying based on a signal received by the tuner.

* * * * *

UNITED STATES PATENT AND TRADEMARK OFFICE
CERTIFICATE OF CORRECTION

PATENT NO. : 7,214,970 B2
APPLICATION NO. : 10/931049
DATED : May 8, 2007
INVENTOR(S) : Tomokazu Andoh It is certified that error appears in the above-identified patent and that said Letters Patent is hereby corrected as shown below:

COLUMN 9:

Line 64, "coefficient a" should read --coefficient $\alpha$--.

COLUMN 12:

Line 58, "is" should read --it--.

COLUMN 13:

Line 22, "+25%" should read --$\pm$25%--.

Signed and Sealed this

Eighteenth Day of November, 2008

JON W. DUDAS
*Director of the United States Patent and Trademark Office*